(12) United States Patent
Yegnashankaran et al.

(10) Patent No.: US 7,052,977 B1
(45) Date of Patent: May 30, 2006

(54) METHOD OF DICING A SEMICONDUCTOR WAFER THAT SUBSTANTIALLY REDUCES THE WIDTH OF THE SAW STREET

(75) Inventors: Visvamohan Yegnashankaran, Redwood City, CA (US); Gobi R. Padmanabhan, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 10 days.

(21) Appl. No.: 10/885,342

(22) Filed: Jul. 6, 2004

(51) Int. Cl.
*H01L 21/46* (2006.01)

(52) U.S. Cl. .................. 438/460; 438/460; 438/736; 438/703

(58) Field of Classification Search ............ 438/460, 438/689
See application file for complete search history.

(56) References Cited

U.S. PATENT DOCUMENTS

| | | | |
|---|---|---|---|
| 4,193,836 A | 3/1980 | Youmans et al. ........... 156/657 |
| 4,962,061 A * | 10/1990 | Takata ........................ 438/622 |
| 5,418,190 A | 5/1995 | Cholewa et al. ............ 437/226 |
| 5,641,714 A | 6/1997 | Yamanaka .................... 438/14 |
| 6,017,804 A | 1/2000 | Freund et al. .............. 438/460 |
| 6,074,934 A | 6/2000 | Dautartas et al. ........... 438/462 |
| 6,294,439 B1 | 9/2001 | Sasaki et al. ............... 438/464 |
| 6,448,153 B1 | 9/2002 | Siniaguine et al. ......... 438/460 |
| 6,488,021 B1 | 12/2002 | Yamane et al. .......... 125/23.01 |
| 6,569,343 B1 * | 5/2003 | Suzuki et al. ................. 216/27 |
| 6,642,127 B1 | 11/2003 | Kumar et al. ............... 438/460 |
| 6,699,774 B1 | 3/2004 | Takyu et al. ................ 438/460 |

FOREIGN PATENT DOCUMENTS

JP 401164046 A 6/1989

\* cited by examiner

*Primary Examiner*—B. William Baumeister
(74) *Attorney, Agent, or Firm*—Mark C. Pickering

(57) ABSTRACT

A semiconductor wafer is diced utilizing a method that etches down to the top surface of the semiconductor wafer a number of times, such as during and following the formation of the metal interconnect structure, and then thins the semiconductor wafer from the back side until the semiconductor wafer singulates.

19 Claims, 5 Drawing Sheets

METHOD OF DICING A SEMICONDUCTOR WAFER THAT SUBSTANTIALLY REDUCES THE WIDTH OF THE SAW STREET

BACKGROUND OF THE INVENTION

1. Field of the Invention

The present invention relates to a method of dicing a semiconductor wafer and, more particularly, to a method of dicing a semiconductor wafer that substantially reduces the width of the saw street.

2. Description of the Related Art

The final back-end processing of a semiconductor wafer typically includes the step of back grinding the wafer (removing a portion of the back side of the wafer to reduce the thickness of the wafer). In addition, the processing also commonly includes the step of bumping the wafer (adding solder bumps to the pads formed on the top surface of the wafer).

The last wafer processing step is the dicing or cutting of the wafer to form a large number of individual die. Each die is then placed in a package, such as a flip-chip package when the die has been bumped, to form a semiconductor chip. The wafer is typically diced to form the large number of individual die by using a wafer saw that physically cuts completely through the wafer to form openings, known as "saw streets," between the individual die.

Current-generation wafer saws provide a minimum street width of two mils ($50.8 \times 10^{-6}$ m) between adjacent die. Since a large number of die are formed when the wafer is diced or cut, the cumulative amount of wafer real estate lost to saw streets is significant. As a result, there is a need for a method of dicing a semiconductor wafer that consumes less area than a saw street.

DETAILED DESCRIPTION OF THE INVENTION

Figure 1:
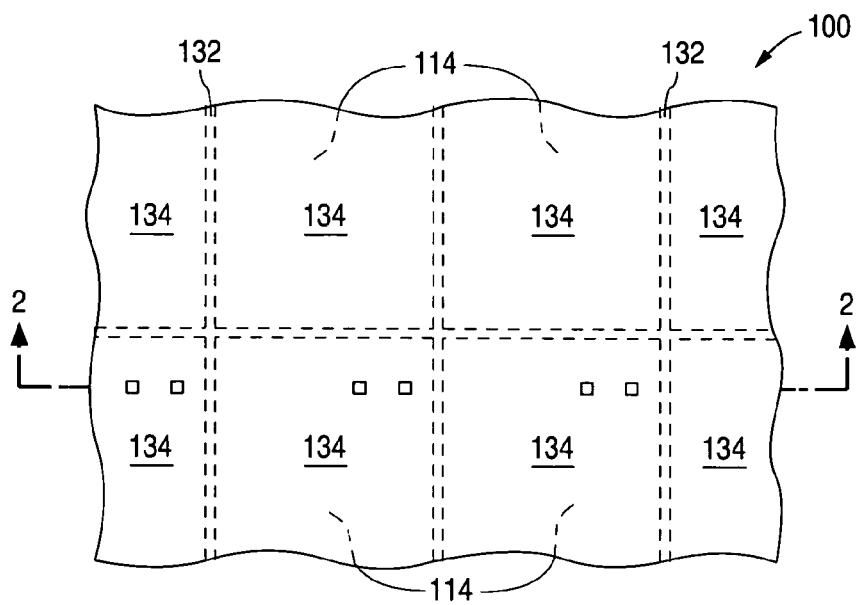
FIG. 1 is a plan view illustrating an example of a semiconductor wafer 100 at an initial processing step in accordance with the present invention.

FIG. 1 shows a plan view that illustrates an example of a semiconductor wafer 100 at an initial processing step in accordance with the present invention. FIGS. 2A–2J show cross-sectional views taken along line 2—2 of FIG. 1 that illustrate an example of a method of dicing wafer 100 in accordance with the present invention.

Figure 2A:
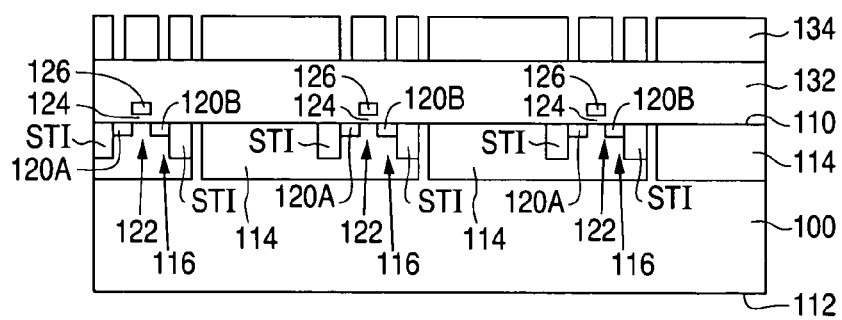
FIGS. 2A–2J are cross-sectional views taken along line 2—2 of FIG. 1 that illustrate an example of a method of dicing wafer 100 in accordance with the present invention.

As shown in FIGS. 1 and 2A, semiconductor wafer 100 includes a top surface 110, a bottom surface 112, and rows and columns of die regions 114 that contact top surface 110. The die regions 114 have substantially equivalent semiconductor structures such that, at the end of the fabrication process, each die region 114 realizes the same circuit.

For example, as shown in FIG. 2A, each die region 114 can have an identically-located MOS transistor 116, and a shallow trench isolation region STI that surrounds MOS transistor 116. MOS transistor 116, in turn, has spaced-apart n+ source and drain regions 120A and 120B that are formed in a p-type semiconductor material, and a channel region 122 of the p-type material that lies between each source and drain region 120A and 120B. MOS transistor 116 also has a layer of oxide 124 that is formed on the top surface 110 of semiconductor wafer 100, and a conductive gate 126 that is formed on the layer of oxide 124 over channel region 122.

The method of the present invention begins by depositing a layer of isolation material 132, such as a layer of oxide, on the top surface 110 of semiconductor wafer 100 over the die regions 114 and the transistors 116. Following this, an etch mask 134 is formed and patterned on the layer of isolation material 132.

Figure 2B:
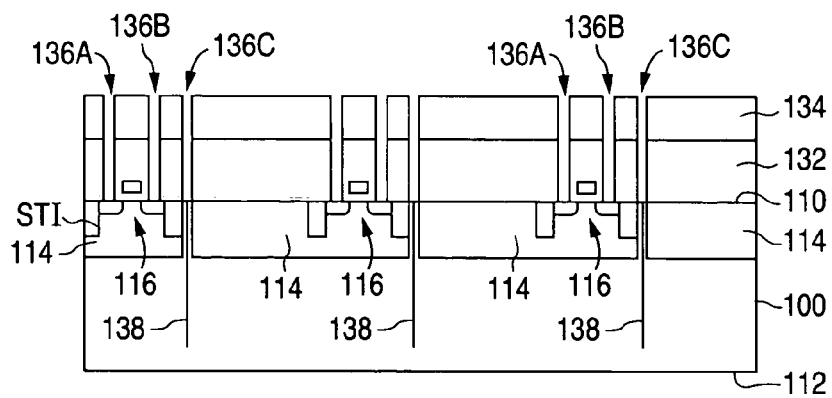

Next, as shown in FIG. 2B, the exposed regions of isolation material 132 are etched until the layer of isolation material 132 has been removed from the top surface 110 of semiconductor wafer 100. The etch forms a large number of contact openings within each die region 114, as represented by a pair of contact openings 136A and 136B that expose the source and drain regions 120A and 120B, respectively, in each die region 114.

The etch of the exposed regions of isolation material 132 also forms a street opening 136C that exposes a street region on the top surface 110 of wafer 100 that lies between adjacent die regions 114. Further, the etch that forms street opening 136C also vertically weakens wafer 100 along a stress line 138 that extends from the street region vertically down towards the bottom surface 112 of wafer 100. Mask 134 is then removed.

Figure 2C:
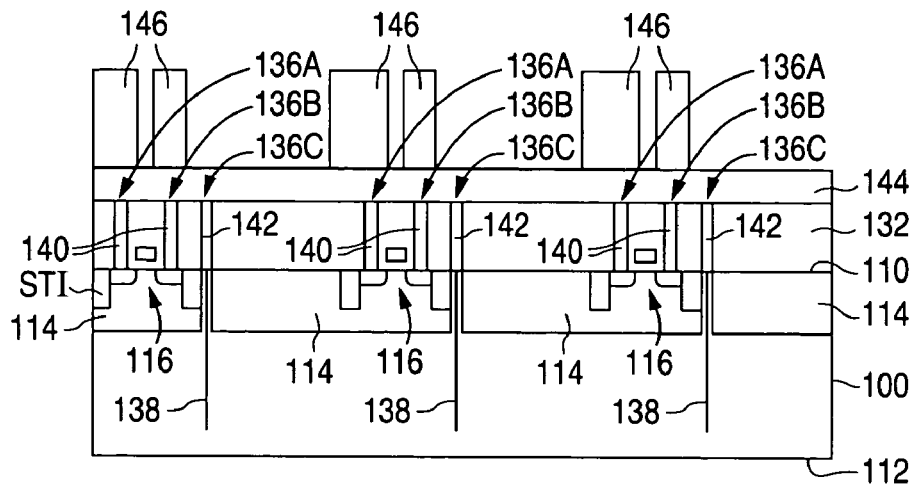

After mask 134 has been removed, a layer of contact material is deposited onto the top surface of isolation material 132 to fill up the contact openings, such as openings 136A and 136B, and the street opening 136C. As shown in FIG. 2C, the layer of contact material is then planarized to remove the layer of contact material from the top surface of isolation material 132, thereby forming contacts 140 in the contact openings, such as openings 136A and 136B, and a contact grid 142 in the street opening 136C. Next, a layer of metal 144, which can include aluminum or copper, is deposited on the top surface of isolation material 132. An etch mask 146 is then formed and patterned on the layer of metal 144.

Figure 2D:
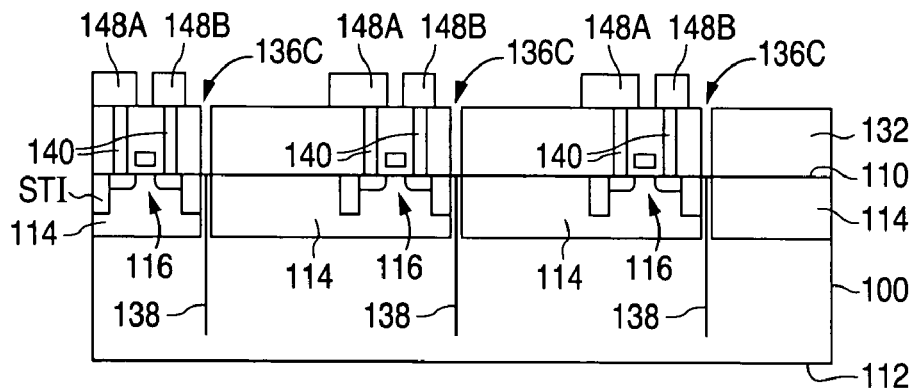

Following this, as shown in FIG. 2D, the exposed regions of the layer of metal 144 are etched to remove the layer of metal 144 from the top surface of isolation material 132. The etch forms a large number of metal-1 traces within each die region 114, as represented by metal-1 traces 148A and 148B.

The etch also removes the layer of metal 144 from over contact grid 142, and continues until contact grid 142 is removed from the top surface 110 of wafer 110. The removal of contact grid 142 reopens street opening 136C which, in turn, again exposes the top surface 110 of semiconductor wafer 100. In addition, the etch that reopens street opening 136C further vertically weakens wafer 100 along stress line 138. Mask 146 is then removed.

Figure 2E:
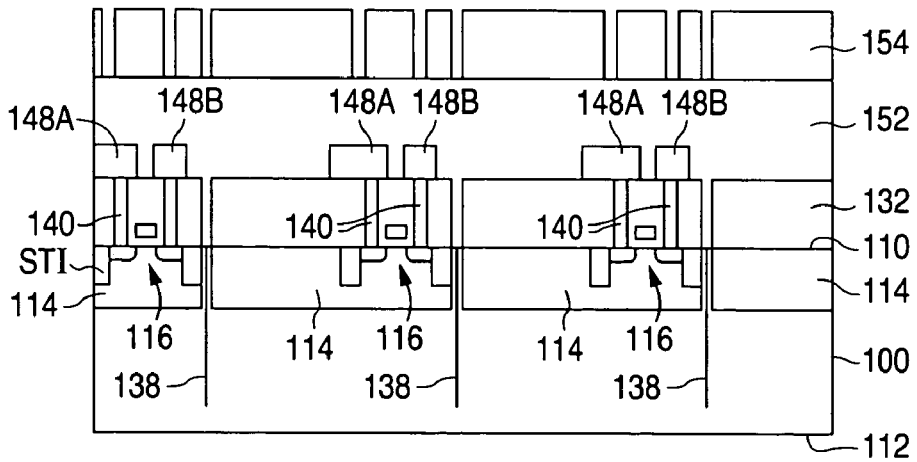

As shown in FIG. 2E, after mask 146 has been removed, a layer of isolation material 152 is deposited onto the top surface of isolation material 132 and the metal-1 traces, such as metal-1 traces 148A and 148B. Following this, an etch mask 154 is formed and patterned on the layer of isolation material 152.

Figure 2F:
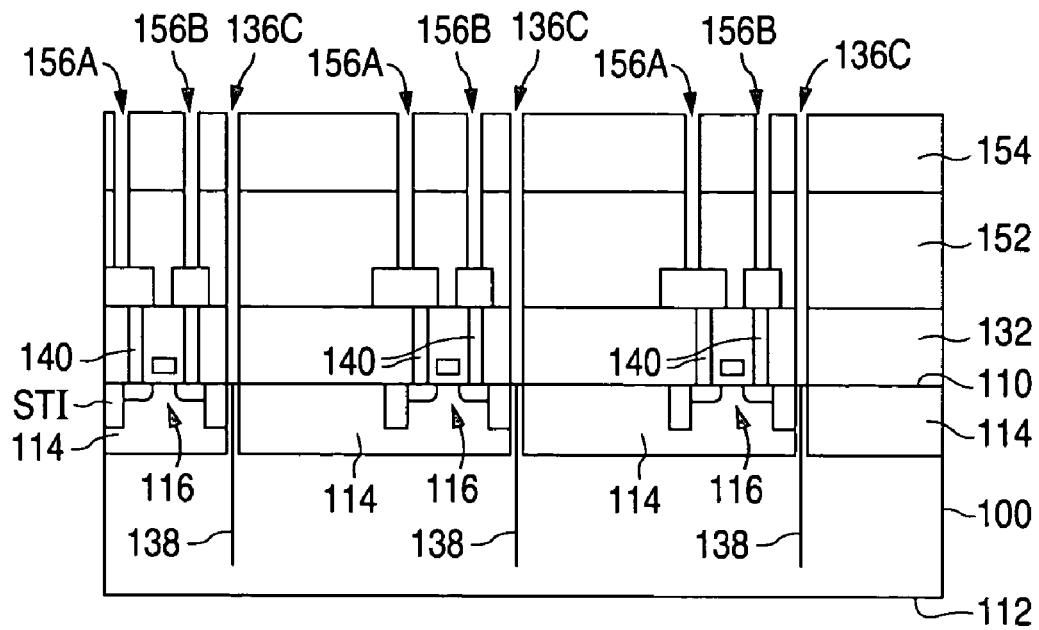

Next, as shown in FIG. 2F, the exposed regions of isolation material 152 are etched until the layer of isolation material 152 has been removed from the top surface 110 of semiconductor wafer 100. The etch forms a large number of via openings within each die region 114, as represented by a pair of via openings 156A and 156B, that expose a corresponding number of regions on the metal-1 traces in each die region 114.

The etch of the exposed regions of isolation material 152 also reopens street opening 136C and again exposes the top surface 110 of semiconductor wafer 100. Further, the etch through isolation material 152 to reopen street opening 136C additionally vertically weakens wafer 100 along stress line 138. Mask 154 is then removed.

Figure 2G:
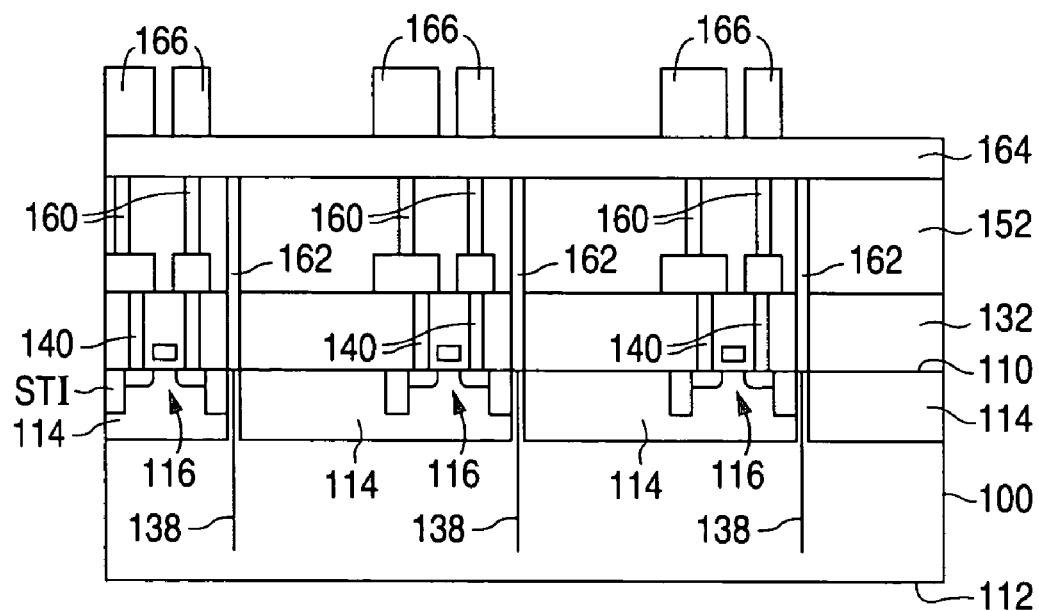

After mask 154 has been removed, a layer of inter-metal material is deposited onto the top surface of isolation material 152 to fill up the via openings, such as openings 156A and 156B, and the street opening 136C. As shown in FIG. 2G, the layer of inter-metal material is then planarized to remove the layer of inter-metal material from the top surface of isolation material 152, thereby forming vias 160 in the via openings, such as openings 156A and 156B, and a via grid 162 in street opening 136C. Next, a layer of metal 164, which can include aluminum or copper, is deposited on the top surface of isolation material 152. An etch mask 166 is then formed and patterned on the layer of metal 164.

Figure 2H:
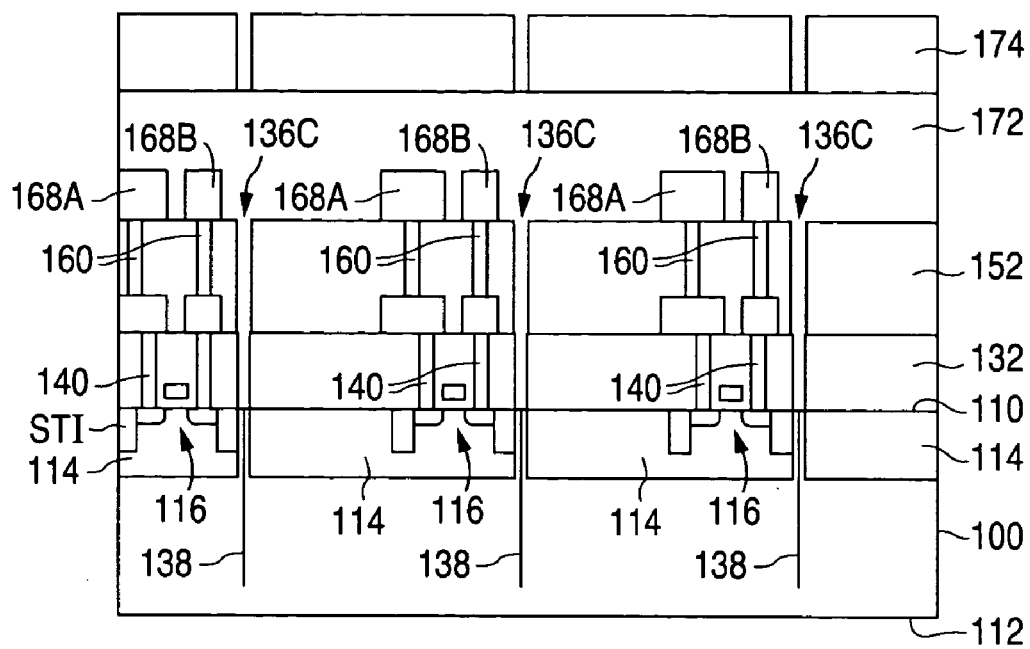

Following this, as shown in FIG. 2H, the exposed regions of the layer of metal 164 are etched to remove the layer of metal 164 from the top surface of isolation material 152. The etch forms a large number of metal-2 traces within each die region 114, as represented by metal-2 traces 168A and 168B.

The etch also removes the layer of metal 164 from over via grid 162, and continues until via grid 162 is removed from the top surface 110 of wafer 110. The removal of via grid 162 reopens street opening 136C which, in turn, again exposes the top surface 110 of semiconductor wafer 100. In addition, the etch that reopens street opening 136C further vertically weakens wafer 100 along stress line 138. Mask 166 is then removed.

The above steps can be repeated as necessary to form as many layers of metal as are required. For purposes of illustration, only two metal layers are shown. Thus, after mask 166 has been removed, a layer of insulation material 172 is deposited onto the top surface of isolation material 152 and the metal-2 traces, such as metal-2 traces 168A and 168B.

Figure 2I:
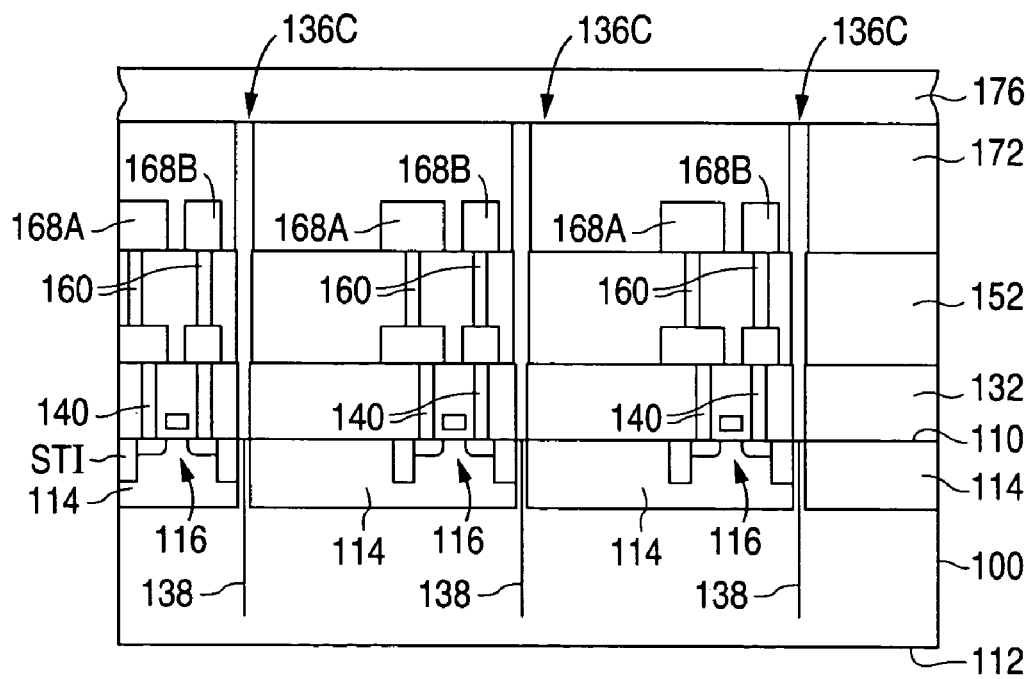

Once the layer of insulation material 172 has been deposited, an etch mask 174 is then formed and patterned on the layer of insulation material 172. Next, as shown in FIG. 2I, the exposed regions of the layer of insulation material 172 are etched until the layer of insulation material 172 has been removed from the top surface 110 of semiconductor wafer 100, thereby again exposing street opening 136C and again weakening wafer 100 along vertical stress line 138.

Figure 2J:
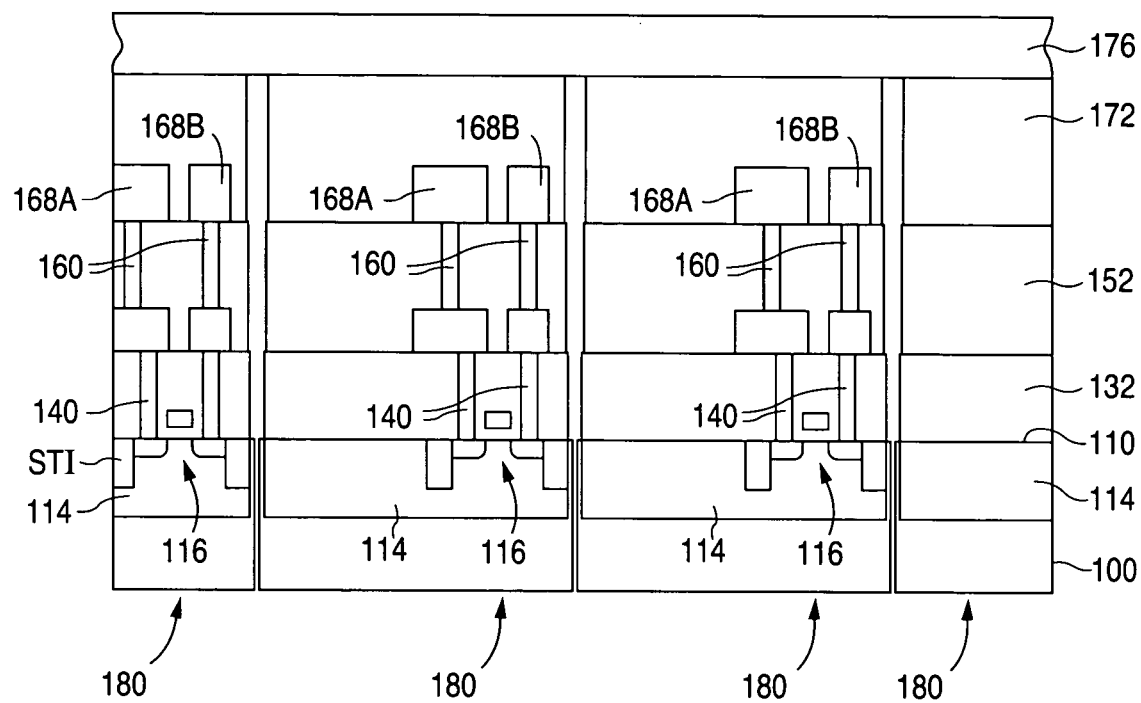

Mask 174 is then removed. After mask 174 has been removed, a layer of adhesive tape 176 is attached to the top surface of insulation material 172. Following this, as shown in FIG. 2J, semiconductor wafer 100 is thinned by removing a portion of the bottom surface 112 of wafer 100.

Semiconductor wafer 100, in turn, can be thinned using conventional approaches, such as back grinding and polishing. Current-generation back grinding processes can reduce the thickness of a wafer to approximately six mils ($152.4 \times 10^{-6}$ m), while current-generation polishers can further reduce the thickness of the wafer to less than three mils ($76.2 \times 10^{-6}$ m).

In accordance with the present invention, semiconductor wafer 100 is thinned until wafer 100 singulates along vertical stress line 138, thereby forming a large number of individual die 180. As noted above, when street opening 136C is formed and the top surface 110 of semiconductor wafer 100 is exposed, the etch process used to form street opening 136C vertically weakens wafer 100 along stress line 138, which lies below the street region that lies between the adjacent die regions 114.

Each subsequent time street opening 136C is reopened and the top surface 110 of semiconductor wafer 100 is exposed, the etch process used to reopen street opening 136C further vertically weakens wafer 100 along stress line 138 by increasing the vertical stress placed on stress line 138.

In accordance with the present invention, by etching down to expose the top surface 110 of semiconductor wafer 100 a number of times during the fabrication process, sufficient cumulative stress can be placed in semiconductor wafer 100 to vertically weaken wafer 100 along stress line 138 such that wafer 100 can singulate when the thickness of wafer is reduced to, for example, less than three mils.

Returning to the present method, after wafer 100 has been singulated, adhesive tape 176, which has an elastic quality, is stretched slightly to separate the individual die 176. Following this, a pick and place machine can individually pick a die 176 from tape 176, and place the die 176 in a package.

One of the advantages of the present invention is that the present invention provides a significant reduction in the area required by a saw street. For example, in a conventional case where a physical saw is utilized, assume a die size of 20 mils ($508 \times 10^{-6}$ m) and a 2 mil ($50.8 \times 10^{-6}$ m) saw street. In this case, the area of a wafer required by a die is 22 mils ($558.8 \times 10^{-6}$ m) square (or 484 square mils of area).

On the other hand, in the present invention, assume a die size of 20 mils ($508 \times 10^{-6}$ m) and a 0.01 mil ($0.244 \times 10^{-6}$ m) wide saw street. (Smaller street widths can also be used.) In this case, the area of the wafer required by the die is only 20.01 mils ($508.244 \times 10^{-6}$ m) square (or 400.4 square mils of area). As a result, the present invention provides a 17% reduction in area when a 0.01 mil ($0.244 \times 10^{-6}$ m) wide street is used. Thus, by utilizing the process of the present invention, significantly more dice can be obtained from a single semiconductor wafer.

Another advantage of the present invention is that the present invention eliminates the wafer sawing step required by conventional fabrication processes. The time and cost required to conventionally dice a semiconductor wafer can rival the time and cost required to fabricate the dice. Thus, by eliminating the need to physically saw a semiconductor wafer, a significant amount of time and cost can be saved.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of dicing a semiconductor wafer, the semiconductor wafer including a top surface, a bottom surface, a plurality of doped regions, and an isolation region, the top surface having a street region, the isolation region extending down from the top surface, and having a bottom surface spaced apart from the bottom surface of the semiconductor wafer, the method comprising:

forming a layer of first material on the semiconductor wafer;

forming a mask on the layer of first material, the mask including a plurality of openings that expose a plurality of first regions of the layer of first material;

etching to remove the first regions of the layer of first material from the top surface of the semiconductor wafer without removing a substantial portion of the top surface of the semiconductor wafer to expose the street region and the doped regions;

forming a layer of second material over the layer of first material;

forming a mask on the layer of second material, the mask including an opening that exposes a second region of the layer of second material;

performing an etch of the layer of second material, the etch removing the second region of the layer of second material from the top surface of the semiconductor wafer without removing a substantial portion of the top surface of the semiconductor wafer to expose the street region;

attaching a wafer holding tape to the layer of second material after the second region has been removed, the semiconductor wafer being free of an opening in the street region that extends vertically below the bottom surface of the isolation region after the wafer holding tape has been attached; and thinning the semiconductor wafer by removing the bottom surface of the semiconductor wafer until the semiconductor wafer singulates into dice.

2. The method of claim 1 wherein the doped regions include a MOS source region that has a bottom surface that lies adjacent to the isolation region.

3. The method of claim 2 wherein the semiconductor wafer is free of an opening in the street region that extends vertically below the bottom surface of the MOS source region after the wafer holding tape has been attached.

4. The method of claim 1 wherein a doped region of the plurality of doped regions has a first conductivity type and a bottom surface, the doped region contacting a laterally-adjacent region of a second conductivity type.

5. The method of claim 4 wherein the semiconductor wafer is free of an opening in the street region that extends vertically below the bottom surface of the doped region after the wafer holding tape has been attached.

6. The method of claim 1 wherein each die of the dice has an identical electrical circuit.

7. The method of claim 1 wherein the layer of first material is a layer of isolation material.

8. The method of claim 7 wherein the layer of first material is removed with an anisotropic etch.

9. The method of claim 7 wherein the layer of second material is a layer of isolation material.

10. The method of claim 9 wherein the semiconductor wafer is thinned by grinding the bottom surface of the semiconductor wafer.

11. The method of claim 9 wherein the semiconductor wafer is thinned by grinding and polishing the bottom surface of the semiconductor wafer.

12. The method of claim 1 and further comprising:

forming a layer of third material on the layer of first material;

forming a mask on the layer of third material; and performing an etch of the layer of third material, the etch of the third layer of material removing a region from the top surface of the semiconductor wafer without removing a substantial portion of the top surface of the semiconductor wafer to expose the street region.

13. The method of claim 12 wherein the layer of third material is metal.

14. The method of claim 13 wherein the layer of first material is a layer of isolation material.

15. The method of claim 14 wherein the layer of second material is a layer of isolation material.

16. The method of claim 1 and further comprising alternately forming additional layers of material and removing portions of the additional layers of material between the layer of first material and the layer of second material, each additional layer of material being removed from a region from the top surface of the semiconductor wafer without removing a substantial portion of the top surface of the semiconductor wafer to expose the street region.

17. The method of claim 16 wherein the additional layers of material include a metal layer and an insulation layer.

18. The method of claim 17 wherein the layer of first material is a layer of isolation material.

19. The method of claim 18 wherein the layer of second material is a layer of isolation material.

* * * * *